US008964922B2

(12) United States Patent
Felder et al.

(10) Patent No.: US 8,964,922 B2
(45) Date of Patent: Feb. 24, 2015

(54) ADAPTIVE FREQUENCY SYNTHESIS FOR A SERIAL DATA INTERFACE

(71) Applicant: Maxim Integrated Products, Inc., San Jose, CA (US)

(72) Inventors: Matthew Felder, Austin, TX (US); Mark Summers, Cary, NC (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/960,158

(22) Filed: Aug. 6, 2013

(65) Prior Publication Data

US 2013/0315359 A1   Nov. 28, 2013

Related U.S. Application Data

(62) Division of application No. 12/971,391, filed on Dec. 17, 2010, now Pat. No. 8,605,846.

(51) Int. Cl.
*H03L 7/16*   (2006.01)

(52) U.S. Cl.
CPC ......................... *H03L 7/16* (2013.01)

USPC ........... 375/362; 375/316; 375/354; 375/355; 375/359; 375/371; 375/372; 375/373; 375/374; 375/375; 375/376

(58) Field of Classification Search
USPC ......... 375/362, 316, 354, 355, 359, 371, 372, 375/373, 374, 375, 376
See application file for complete search history.

(56) References Cited

U.S. PATENT DOCUMENTS

| 6,492,928 | B1 * | 12/2002 | Rhode et al. | 341/144 |
| 6,667,704 | B1 * | 12/2003 | Grale et al. | 341/123 |
| 7,711,974 | B1 * | 5/2010 | You et al. | 713/500 |
| 2005/0010399 | A1 * | 1/2005 | Duewer | 704/212 |
| 2009/0063071 | A1 * | 3/2009 | Max et al. | 702/69 |

* cited by examiner

*Primary Examiner* — Siu Lee
(74) *Attorney, Agent, or Firm* — North Weber & Baugh LLP

(57) ABSTRACT

Various embodiments of the present invention relate to systems, devices and methods of oversampling electronic components where high frequency oversampling clock signals are generated internally. The generated oversampling clock is automatically synchronous with the input clock and the input serial data in a serial data link, and is adaptive to predetermined parameters, such as bit depth and oversampling rate.

5 Claims, 4 Drawing Sheets

200

ADAPTIVE FREQUENCY SYNTHESIS FOR A SERIAL DATA INTERFACE

CROSS-REFERENCE TO RELATED APPLICATIONS

This application is a divisional of previously filed copending application Ser. No. 12/971,391, filed Dec. 17, 2010, which application is hereby incorporated herein by reference in its entirety and from which application priority is hereby claimed under 35 U.S.C. 119(e) and 120.

BACKGROUND

A. Technical Field

The present invention relates to the field of electronics and data communication, and more particularly, to systems, devices and methods of employing an internal frequency synthesizer to generate high frequency oversampling clocks adaptive to predetermined parameters, such as a bit depth and an oversampling rate, for a serial data interface.

B. Background of the Invention

A large amount of signals are transmitted between different components in an embedded hardware system, and to maintain high efficiency, the signals have to be coordinated using a specific signal transmission standard. The Serial Peripheral Interface (SPI) is a generic standard applicable to most embedded systems. It is a synchronous serial data link standard which connects a master device and its slave devices through four standard logic signals, serial clock (SCLK), data in (DIN), data out (DO) and slave select (SS). Input serial data are synchronized with the input serial clock and converted to parallel control outputs in the slave devices under the control of the slave select. The data are returned from the selected slave device as a serial digital signal or as an analog signal, and thus, only one output pin is needed for the master device to receive the outcome. As the parallel-to-serial and serial-to-parallel data shifting techniques mature, the use of the Serial Peripheral Interface allows tremendous pin count reduction and board real estate saving while consuming only limited chip area for data shifting. Nowadays, the Serial Peripheral Interfaces are used in microprocessors, microcontrollers and their peripherals such as sensors, actuators, cameras, memory arrays and displays.

In many digital audio systems, the Serial Peripheral Interface may be further simplified to a three-signal Integrated Interchip Sound (I2S) interface. These audio systems normally include audio media (tape, compact disc or digital TV sound) and a number of processing circuits comprising analog-to-digital converters (ADCs), digital-to-analog converters (DACs), error correction circuit, digital filters and interface electronics. The data out signal in the SPI is also needed in the I2S interface when returned data are involved in some audio applications, such as audio ADCs. The slave select signal in the SPI is converted to a low frequency left/right clock (LRCLK), which is also called as word select (WS). In a stereo system, the left/right clock multiplexes two audio channels through its logic levels in the time domain. The audio information is stored in the data in (DIN) signal and the DIN signal is synchronized with the serial clock (SCLK) which is often called as bit clock (BCLK) in audio applications. Most audio systems function under the control of such a three- or four-signal I2S interface comprising the bit clock, the left/right clock and the serial data in and/or serial data out.

The SPI interface and the I2S interface meet data communication requirements in most embedded and audio systems; however, additional high frequency clock signals may be required in some applications. For example, A/D and D/A converters in many audio systems involve sigma-delta ($\Sigma$-$\Delta$) modulation and a high frequency master clock (MCLK) is required for oversampling in A/D or D/A conversion. The frequency of the master clock is an integer multiple, typically 128, of the left/right clock frequency. This ratio of the MCLK/LRCLK is also referred to as the oversampling rate. The master clock is used to generate an oversampling clock, and therefore, the jitter noise of the master clock has to be low enough to avoid degrading the audio quality. Constrained by such a low jitter requirement, the A/D and D/A converters in prior arts rely on external master clock signals. However, the incoming master clock is required to synchronize with the I2S interface, and the drive circuit of the master clock may dominate power consumption in the input/output (I/O) interface and potentially causes electromagnetic interferences or compatibility (EMI/EMC) issues. The master clock provided externally is not a preferred solution for a low-power low-cost device.

Data transmission using serial data interfaces has significantly reduced the pin count for integrated circuit components. However, additional pin count reduction is highly desirable in order to further simply system integration and enhance cost efficiency. The prior arts in some audio applications reduce the pin count by regenerating the bit clock from the master clock using digital dividers. The aforementioned issue of power consumption still exists. Data clock synchronization becomes another challenge and may impose unexpected constraints on clock timing.

SUMMARY OF THE INVENTION

Various embodiments of the present invention relate to systems, devices and methods of frequency synthesis that generate a higher frequency oversampling clock signal adaptive to predetermined parameters. This adaptive frequency synthesis is monolithically integrated into integrated circuit (IC) components to reduce the pin count and improve cost efficiency.

Certain embodiments of the IC components that adaptively synthesize the oversampling clock are the Integrated Interchip Sound (I2S) devices, such as an I2S digital-to-analog converter (DAC). The I2S DAC receives a bit clock, a left/right clock and input serial data from the I2S interface bus, and it comprises a frequency detector, a clock generator, a shift register and a DAC core. The frequency detector determines an output frequency control needed for the clock generator to generate the synchronous oversampling clock that can provide a desired oversampling rate for the input left/right clock. Although an I2S DAC normally has a limited number of combinations for the left/right clock and the bit clock frequencies, the clock frequencies are unknown to the I2S DAC upon receiving them. The bit depth is determined by the number of BCLK clock cycles that are counted in half of a left/right clock cycle. In one embodiment, a reference clock is needed to further identify the absolute magnitude of the clock frequencies from the available combinations. This reference clock frequency within a rough range of a known frequency is sufficient to instruct the frequency detector to generate the appropriate output frequency control. The clock generator is therefore controlled to generate an oversampling clock that is used for $\Sigma$-$\Delta$ modulation in the DAC core. The frequency of the oversampling clock matches a desired oversampling rate which is usually 64-256 times of the left/right clock frequency.

To further reduce the pin count of an I2S DAC, only one of the bit clock or the left/right clock is needed besides the input serial data from an I2S interface bus. The other clock is generated locally on chip. In one embodiment, the bit clock is the only input clock, and the left/right clock is generated by a digital divider according to the predefined bit depth while the rest of the I2S DAC remains the same for the oversampling clock generator and DAC core. In another embodiment, the left/right clock is the only input clock directly used for adaptive oversampling clock synthesis and the bit clock is obtained by dividing down the oversampling clock. The generated clocks, oversampling clock, bit clock or left/right clock, are adaptive to the predetermined bit depth and oversampling rate.

One skilled in the art will recognize that the methods of generating the oversampling clock are applicable to any serial data system where a high frequency oversampling clock is needed. In one embodiment, a serial periphery interface (SPI) devices may use this method to generate oversampling clocks.

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. ("FIG.") 1 illustrates a block diagram of an audio digital-to-analog converter driven by a standard I2S interface and an external master clock.

DETAILED DESCRIPTION OF THE PREFERRED EMBODIMENTS

Embodiments of the present invention provide systems, devices and methods of employing an internal frequency synthesizer to generate high frequency oversampling clocks adaptive to predetermined parameters, such as the bit depth and the oversampling rate, for a serial data interface. In the following description, for purposes of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of structures. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention. In particular, the embodiments are focused on an audio DAC that employs a standard I2S interface bus and requires a high frequency master clock for oversampling clock generation. One skilled in the art will recognize that the claimed invention is applicable to any electronic device that is driven by a standard serial data interface and requires an additional oversampling clock.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

Figure 1:
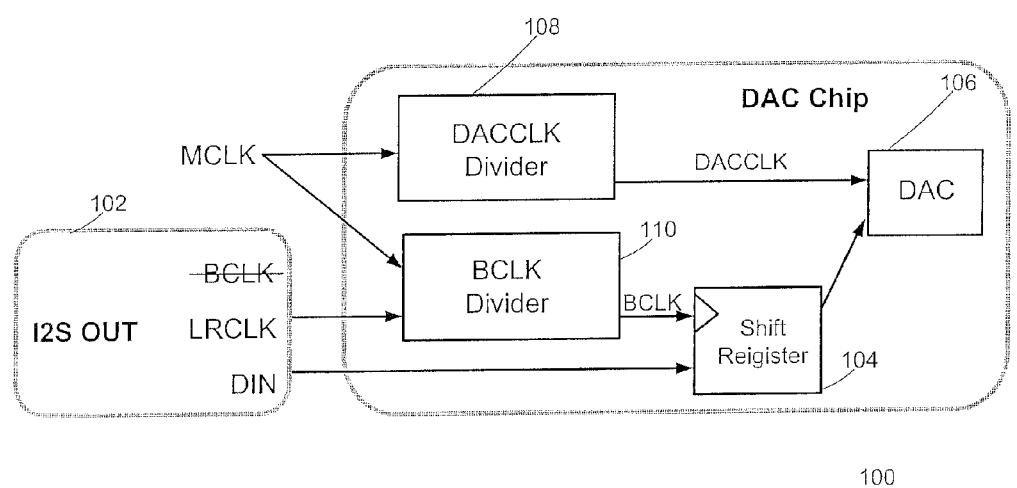

FIG. 1 illustrates a block diagram 100 of an audio DAC driven by a standard I2S interface 102 and an external master clock MCLK. The I2S interface bus 102 comprises a time-multiplexed input serial data (DIN), a left/right clock (LRCLK) and a bit clock (BCLK). The audio information is recovered from the input serial data using a shift register 104 that is controlled by the bit clock and the left/right clock. The left/right clock is employed to separate the data for two different channels, and serial audio data at a typical bit depth of 16-, 24- or 32-bit are extracted during consecutive clock cycles. The parallel data generated by the shifter register 104 is processed by a DAC core 106 to provide an analog voltage.

Most audio DACs use sigma-delta ($\Sigma$-$\Delta$) modulation to shape the noise spectrum. The digital sound information is represented with a quantized signal at the left/right clock frequency which represents an audio sample frequency (i.e. Nyquist Sampling Frequency) of DACs. Digital interpolators are applied to insert intermediate digital levels between two consecutive inputs. Despite the interpolation, the digital format is unavoidably associated with a quantization noise which indicates the errors introduced by rounding off a continuous analog signal level to discrete digital representations. The quantization noise density normally has a flat spectrum up to the audio sample frequency. In the $\Sigma$-$\Delta$ modulation, a higher frequency clock is employed to oversample the transient audio data from the digital interpolators. Processed by the $\Sigma$-$\Delta$ modulator, the noise spectrum is modulated to a bell shape whose peak is located at half of the oversampling frequency. A low-pass filter may easily eliminate the noise peak prior to the final DAC output. A typical oversampling clock frequency is 128 times of the left/right clock frequency. This oversampling clock is required to have higher frequency and low jitter to maximize the output signal quality.

In the audio DAC 100, an external master clock (MCLK) is provided to be used as a DAC oversampling clock (DACCLK) or generate the DACCLK using a digital DACCLK divider 108. Thus, the conventional audio DAC 100 comprises three clock signals, the master clock, the left/right clock and the bit clock. The master clock has the largest frequency, and the left/right clock has the smallest frequency among these three clocks. In order to reduce the pin count, the left/right clock and the bit clock may be regenerated from each other or from the master clock. FIG. 1 depicts an example of generating a synchronous bit clock using a BCLK digital divider 110 to process the master clock and the left/right clock. A low jitter master clock input is unavoidable if an internal clean clock generation is not possible or the Σ-Δ modulator still has strict jitter tolerance.

Figure 2:
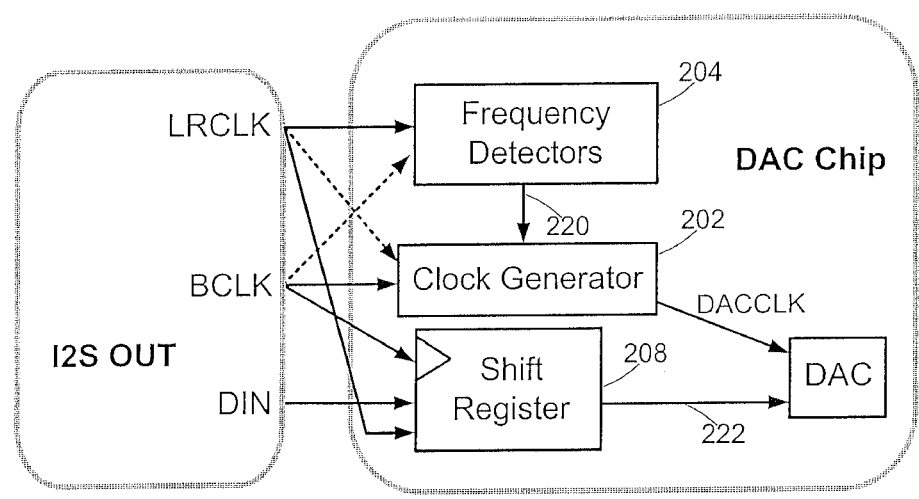
FIG. 2 illustrates a block diagram of an audio digital-to-analog converter driven by a standard I2S interface according to various embodiments of the invention.

FIG. 2 illustrates a block diagram 200 of an audio DAC driven by a standard I2S interface. A frequency detector 204 receives the LRCLK and/or BCLK signals to generate an output frequency control 220 to configure a clock generator 202. The clock generator 202 employs the LRCLK and/or BCLK signals as a reference to generate a oversampling clock (DACCLK) required by a conventional audio DAC. The input serial data (DIN) is still shifted to parallel data 222 by the shift register 208 under the control of BCLK and LRCLK. The synchronous DACCLK is then used in the Σ-Δ modulator for the subsequent digital-to-analog conversion process on the parallel data 222.

In certain embodiments, a phase lock loop (PLL), a delay lock loop (DLL) or a frequency lock loop (PLL) is used as the clock generator 202 to generate a synchronous DACCLK signal from the bit clock (BCLK). A PLL is normally applied to correlate the phase of an output signal to that of an input reference, and it typically comprises a PLL core circuit and a feedback frequency divider. The PLL core circuit comprises a phase detector (PD), a charge pump (CP), a loop filter, and a voltage controlled oscillator (VCO). The PLL generates an intermediate PLL clock whose frequency is an integer multiple of the input frequency, and the integer is equal to the value of the feedback frequency divider. A fractional PLL may also be used to generate a fractional ratio between the intermediate PLL clock frequency and the input frequency. One or both of a prescaling divider and a postscaling divider may be used with the PLL to further introduce another fractional ratio between the frequencies of the PLL output clock and the input reference clock. Those skilled in the art will see that either BCLK or LRCLK may be used as the reference clock to the PLL. In certain embodiments, the BCLK is preferred for use as the reference clock due to its higher frequency. The cutoff frequency of the PLL loop filter can be too low to implement on chip if the lower frequency clock LRCLK is used. In this embodiment, BCLK is the input reference clock and the DACCLK is the target clock. Hence, the oversampling frequency $f_{DACCLK}$ of the DACCLK is represented as $$f_{DACCLK} = \frac{f_{BCLK}}{L}\frac{M}{N} \quad (1)$$

where $f_{BCLK}$ is the bit clock frequency, and L, M and N are the fractional values for the PLL prescaling, feedback and postscaling dividers, respectively. Despite the convenience of using a PLL or DLL, one skilled in the art will recognize that it is also possible to use a frequency locked loop as a frequency multiplier to generate the oversampling clock.

Embodiments of the invention are applicable under the condition that the jitter noise of the internal clock meets the DAC jitter requirement. The jitter noise of a phase lock loop clock generator is often larger than the jitter tolerance (~200 picoseconds) of a conventional audio DAC by more than one order. Therefore, to employ the internal clock as a DAC oversampling clock, the Σ-Δ modulator has to be redesigned to accommodate the jitter degradation; otherwise, a low jitter clock generator needs to be implemented with additional chip area and power consumption.

For an I2S DAC (in FIG. 2), the DACCLK oversampling frequency is adaptive to the bit depth and LRCLK rate. A typical bit depth of 16-, 24- or 32-bit requires that each half LRCLK cycle related to one channel includes at least that number of bit clock cycles. Hence, the bit clock frequency $f_{BCLK}$ is normally 32, 48 or 72 times of the LRCLK frequency $f_{LRCLK}$ because $$f_{BCLK}=2\times\text{BitDepth}\times f_{LRCLK} \quad (2)$$

half an LRCLK cycle relates to one audio channel, and the interpolated DAC data typically have to be sampled for 128 times for one data point in a channel. Hence, $$f_{DACCLK}=\text{OverSampleRatio}\times f_{LRCLK} \quad (3)$$

where OverSampleRatio is the ratio between the DACCLK and LRCLK frequencies.

In the embodiment of the clock generator based on the PLL, the frequency detector 204 receives LRCLK, BCLK or both from the I2S interface bus, and generates the output frequency control 220 according to the specific bit depth and oversampling rate requirements. The enabling signals are used to identify appropriate dividing parameters L, M, and N for the PLL or DLL. Table 1 lists exemplary parameters, including the bit depth, the frequencies of the LRCLK, BCLK and DACCLK, and the divider parameters, for a typical audio DAC product which requires an oversampling rate of 128 samples per channel. In this specific embodiment, the dividing parameters L, M and N are determined according to the following rules:

(a) If the LRCLK frequency is larger than 48 kHz, L is equal to 2; otherwise L is equal to 1;

(b) if the LRCLK frequency is equal to 8 kHz or 16 kHz, N is equal to 18 or 9, respectively; if the LRCLK frequency is larger than 16 kHz, N is 3; and (c) the dividing parameter N is determined to ensure that the generated frequency $f_{DACCLK}$ satisfies equations (1), (2) and (3).

For example, a LRCLK at a frequency of 8 kHz is associated with a BCLK frequency of 256 kHz if the bit depth is 16. The PLL input divider for the PLL is negligible since the LRCLK frequency is less than 48 kHz, and the PLL output divider has a fraction value of 18. The feedback divider in the PLL is a divide-by-72 divider and generates a satisfactory oversampling clock of 1024 kHz for an oversample rate of 128.

Figure 3:
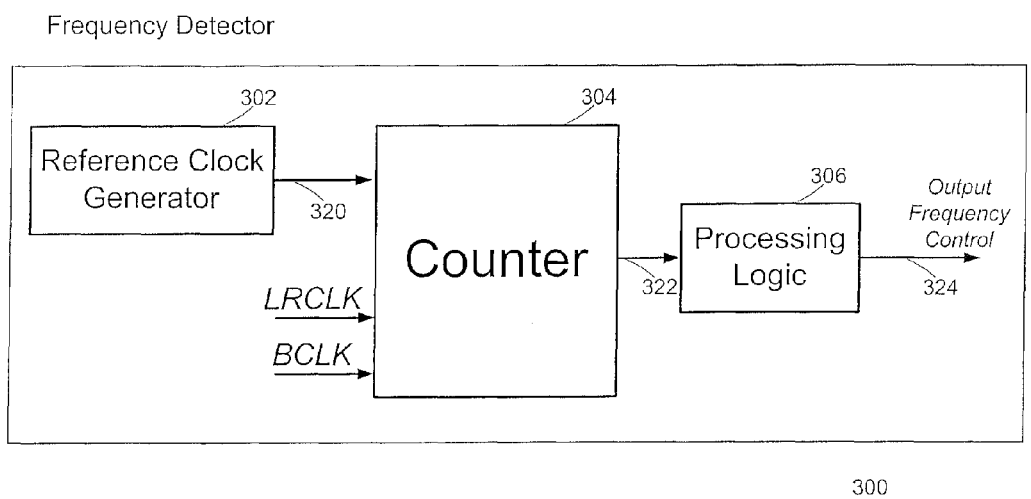
FIG. 3 illustrates a frequency detector according to various embodiments of the invention.

FIG. 3 illustrates an embodiment of a frequency detector 300 which is intended to generate the output frequency control 324 (220 in FIG. 2) as suggested above. In this embodiment, a reference clock generator 302 is required to provide a reference clock 320 for the operation of the frequency detector 300. A counter block 304 comprises one or more counters to count the cycles of any higher frequency clock within that of another lower frequency clock. The clocks used by the counter block 304 are selected from the reference clock 320, LRCLK or BCLK. The counter block 304 outputs the numbers of counted clock cycles as multiple bit signals 322. The subsequent processing logic 306 uses the multiple bit signals 322 to determine an output frequency control 324 and thus select a case from Table 1.

TABLE 1

Oversampling clock generation from I2S BCLK and/or LRCLK

| LRCLK (KHz) | Bit Depth | BCLK (KHz) | Input Divider | Feedback Divider | Output Divider | DACCLK (kHz) OSR = 128 |
|---|---|---|---|---|---|---|
| 8 | 16 | 256 | 1 | 72 | 18 | 1024 |
| 8 | 24 | 384 | 1 | 48 | 18 | 1024 |
| 8 | 32 | 512 | 1 | 36 | 18 | 1024 |
| 16 | 16 | 512 | 1 | 36 | 9 | 2048 |
| 16 | 24 | 768 | 1 | 24 | 9 | 2048 |
| 16 | 32 | 1024 | 1 | 18 | 9 | 2048 |
| 32 | 16 | 1024 | 1 | 12 | 3 | 4096 |
| 32 | 24 | 1536 | 1 | 8 | 3 | 4096 |
| 32 | 32 | 2048 | 1 | 6 | 3 | 4096 |
| 44.1 | 16 | 1411.2 | 1 | 12 | 3 | 5644.8 |
| 44.1 | 24 | 2116.8 | 1 | 8 | 3 | 5644.8 |
| 44.1 | 32 | 2822.4 | 1 | 6 | 3 | 5644.8 |
| 48 | 16 | 1536 | 1 | 12 | 3 | 6144 |
| 48 | 24 | 2304 | 1 | 8 | 3 | 6144 |
| 48 | 32 | 3072 | 1 | 6 | 3 | 6144 |
| 88.2 | 16 | 2822.4 | 2 | 12 | 3 | 5644.8 |
| 88.2 | 24 | 4233.6 | 2 | 8 | 3 | 5644.8 |
| 88.2 | 32 | 5644.8 | 2 | 6 | 3 | 5644.8 |
| 96 | 16 | 3072 | 2 | 12 | 3 | 6144 |
| 96 | 24 | 4608 | 2 | 8 | 3 | 6144 |
| 96 | 32 | 6144 | 2 | 6 | 3 | 6144 |

The reference clock 320 is generated within a certain range of a known frequency $f_{REF}$ which may be higher, lower or between the BCLK and LRCLK frequencies. In one embodiment, an error up to 30% can be normally tolerated, and therefore, conventional circuit topologies, such as ring oscillators or VCOs, can be easily implemented to generate the reference clock 320.

In certain embodiments, a counter in the counter block 304 is employed to count the number of the BCLK cycles within each LRCLK clock cycle. The output is a multiple bit signal that is a binary representation of the bit depth which could be any of 16, 24 or 32 as suggested in Table 1. This first counting step eliminates two thirds of the available cases in Table 1.

In certain embodiments, the subsequent counting steps may be implemented as counting a higher frequency clock cycle within a lower frequency clock cycle. The counting output is sufficient to indicate the frequencies of BCLK, LRCLK and DACCLK, and identify the actual case from Table 1. Although no specific frequency is required for the reference clock, a frequency higher than the LRCLK frequency is preferred. For example, if the target reference clock frequency is 200 kHz, it may vary by ±15% between 170 kHz and 230 kHz. The counting result is located within a specific range when cycles of such an uncertain reference clock are counted within a cycle of an available LRCLK clock using a counter in the counter block 304. LRCLK of 8 kHz should output a number between 43 and 58, 16 kHz between 21 and 29, 32 kHz between 11 and 13, 44.1 kHz between 8 and 10, 48 kHz between 7 and 10, 88.2 kHz between 4 and 5, and 96 kHz between 4 and 5. The cases of LRCLK equal to 44.1 kHz and 48 kHz do not need to be differentiated because they share the same PLL divider parameters even though the DACCLK frequency varies slightly. For the same reason, the cases of LRCLK equal to 88.2 kHz and 96 kHz do not need to be differentiated. As a result, the output of the counter falls into one of the non-overlapping output ranges. Given the bit depth, the frequencies of all involved clocks and the PLL dividing parameters (L, M and N) are completely identified in Table 1. Therefore, the output frequency control 324 is generated by the processing logic 306 based upon the counter outputs falling within the non-overlapping ranges. The appropriate PLL setups may be enabled for the subsequent PLL according to the output frequency control 324, and the oversampling clock generated by the PLL is adaptive to the oversampling ratio and sometimes to bit depth as well.

An advantage of this invention is to remove the pin for the master clock (MCLK) and generate an oversampling clock DACCLK from the I2S interface bus according to the oversampling rate requirement. One skilled in the art will recognize that a phase lock loop is one exemplary circuit to generate the oversampling clock. One skilled in the art will also recognize that the counter-based frequency detector depicted in FIG. 3 is merely an exemplary frequency detector providing appropriate output frequency control to the phase lock loop.

From a system perspective, regardless of the details of the frequency detector or the clock generator, the pin count of the audio DAC may be further reduced using only one of the two clocks, BCLK or LRCLK, in the audio I2S interface bus. However, use of one I2S interface clock as an input clock is plausible only when the channel boundaries and bit depth are determined. The channel boundaries within the input data DIN are automatically determined if the input clock is the LRCLK, and however, may need a special code sequence to be attached as headings for audio data of each channel if the input clock is the BCLK. The bit depth is programmed to the hardware circuit or recovered from the DIN and the input clock. In certain embodiment, the bit depth may also be programmed as another special code sequence to the unused bits inside a channel. A function module may be integrated in the shifter register to determine the channel boundaries and bit depth if the information is coded as special sequences in the audio data.

Figure 4A:
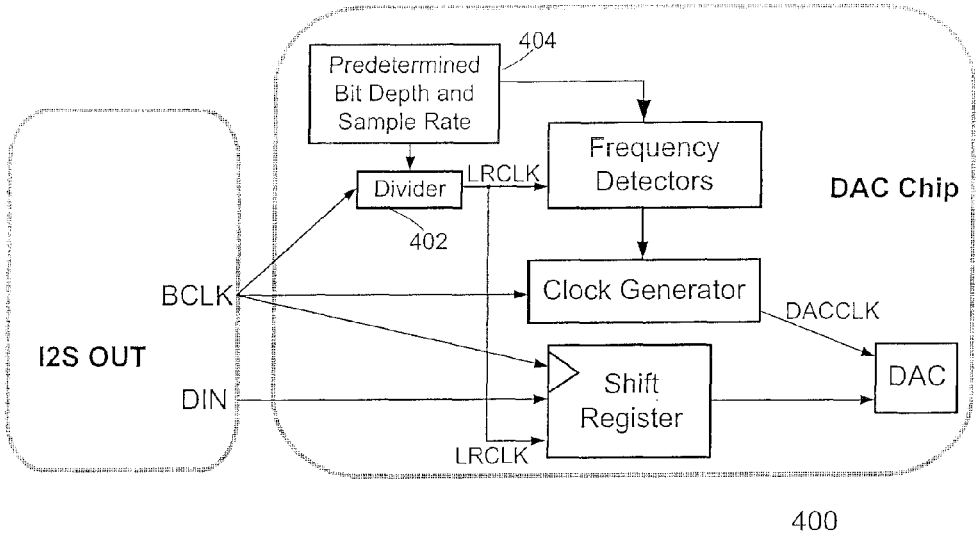
FIG. 4A illustrates a block diagram of an audio digital-to-analog converter driven by the bit clock and input serial data according to various embodiments of the invention.

FIG. 4A illustrates a block diagram 400 of an audio DAC driven by the bit clock and input serial data. The DAC 400 not only generates the oversampling clock DACCLK as previously described but also internally generates LRCLK for use in DACCLK generation. The bit depth determines the LRCLK, and the boundary of the input serial data (DIN) for each channel can be identified by the special code sequence attached as heading to audio data for each channel. The real bit depth may be different when empty bits are filled into the data for one channel. If such a real bit depth is fixed and predetermined in the DAC 400, a digital divider 402 can receive the bit clock BCLK and generate LRCLK according to this known real bit depth. LRCLK and BCLK are further used to generate DACCLK according to the method described in FIG. 2 and FIG. 3.

Figure 4B:
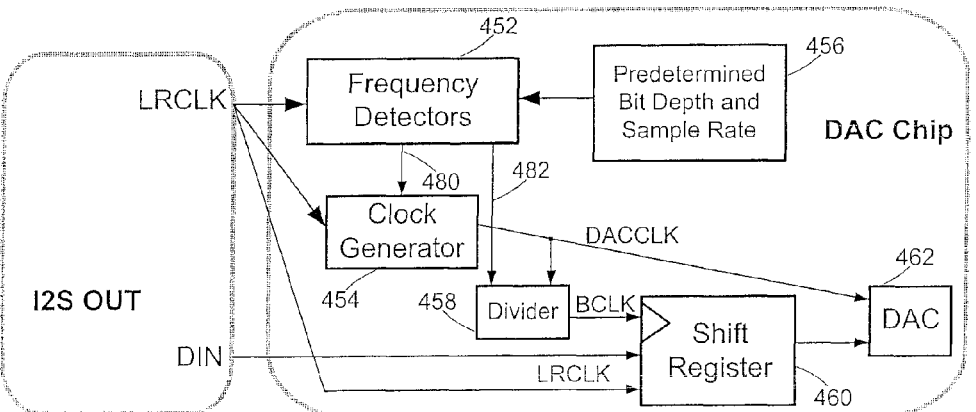
FIG. 4B illustrates a block diagram of an audio digital-to-analog converter driven by the left/right clock and input serial data according to various embodiments of the invention.

FIG. 4B illustrates a block diagram 450 of an audio digital DAC driven by the left/right clock LRCLK and input serial data. Both BCLK and DACCLK are internally generated from LRCLK. In this embodiment, the bit depth and the oversampling rate may be determined for the frequency detector 452. Since the LRCLK is known, the bit depth may also be determined by monitoring the input data DIN within an LRCLK cycle. This approach is known as "clock and data recovery" and often used in a single clock data interface. In this approach, the maximum number of transitions for the DIN is counted within a known LRCLK cycle, or the minimum pulse width of the DIN is compared with the known LRCLK cycle to predict the bit depth. A function module may be integrated in the shifter register to determine the bit depth by the "clock and data recovery" approach.

The frequency detector 452 further receives LRCLK and provides a control 480 based on the oversampling rate. Configured by the control 480, the clock generator 454 receives the LRCLK and provides the higher frequency oversampling clock DACCLK. The ratio between the frequencies of DACCLK and LRCLK is the oversample ratio. While DACCLK is employed directly by the DAC for oversampling, DACCLK is also sent to a divider 458 and used to generate the BCLK. The divider 458 has to receive a control 482 from the frequency detector to determine the ratio between DACCLK and BCLK. The control 482 is a function of the bit depth and the oversampling rate as determined in the frequency detector 452. Once BCLK and DACCLK are generated, the shift register 460 converts the input serial data DIN to parallel data which are further processed by the DAC core 462 to output an analog signal. Input serial data DIN and the generated BCLK are required to be synchronized, and data extraction errors may be reduced by automatic adjustment of the generated BCLK to capture the DIN data near the middle of the data pulses.

An alternative embodiment may be applied to generate BCLK and DACCLK from LRCLK. A first clock generator is used to generate BCLK directly from LRCLK, and if a PLL is used, the divider parameters in the PLL may be easily derived from the bit depth. A second clock generator is used to generate DACCLK from LRCLK or the newly generated BCLK. If a second PLL is used as the second clock generator and LRCLK is used as the reference clock, the divider parameters simply relate to the oversampling ratio; if BCLK is used as the reference clock, the divider parameters are derived from both the bit depth and oversampling rate. The frequency detector can generate an output frequency control to appropriately set up the dividers for the PLL.

When the only provided reference clock is LRCLK, which has the lowest frequency among all three involved clocks, LRCLK, BCLK and DACCLK, a PLL is used to generate a high frequency clock from a low frequency clock and unavoidably has to function at a low frequency. The chip area needed to implement the clock generator may be significant and, sometimes, off-chip capacitors are needed. Comparably, the benefit of reducing the pin count is overshadowed, and the need to reduce the pin count to LRCLK and input serial data has to be reevaluated for each individual case.

The audio DAC is a slave audio device utilizing the standard I2S interface bus. The embodiments used in this invention disclosure are focused on generating oversampling clocks to reduce the pin count for the audio DAC. One skilled in the art will recognize that the same devices and methods are applicable to other master or slave audio devices using the standard I2S interface bus.

One skilled in the art will recognize that the same methods, systems and devices for generating an adaptive oversampling clock in an I2S device is applicable in other master or slave devices using a serial data interface, such as a SPI. An input clock (serial clock in a SPI) and an input control signal (slave select in SPI) are corresponding to the bit clock and the left/right clock in an I2S device and applicable for oversampling clock generation. The correlation between the clock frequencies is determined by characteristic parameters for the specific system. A frequency detector relies on such correlations to generate an output frequency control to configure a subsequent clock generator to generate an oversampling clock. The oversampling clock is synchronous with the input clock, the input control signal and the input serial data. Similarly, the frequency detector may include a reference clock compared to the input clock, or the input control signal for generating the output frequency control.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A serial data interface device, comprising:
an input port, coupled to receive an input clock, an input control and input serial data from a serial interface bus;
a frequency detector, coupled to receive the input clock and the input control, the frequency detector generating an output frequency control based on a relationship between a frequency of the input clock and a frequency of the input control; and
a clock generator, coupled to receive the output frequency control, the clock generator generating an oversampling clock based on the output frequency control and an oversampling ratio, such that the oversampling clock does not rely on a master clock provided by an external source.

2. The serial data interface device of claim 1, wherein the clock generator is coupled to receive one signal selected from a group consisting of the input clock and the input control, and the oversampling clock is synchronous with the input signal, the input control and the input serial data in the serial data interface.

3. The serial data interface device of claim 1, wherein the clock generator is selected from a group consisting of a phase lock loop circuit, a delay lock loop circuit and a frequency lock loop circuit.

4. A serial data interface device comprising:
an input port, coupled to receive an input clock, an input control and input serial data from a serial interface bus;
a frequency detector, coupled to receive the input clock and the input control, the frequency detector generating an output frequency control based on a relationship between a frequency of the input clock and a second frequency of the input control;
a clock generator, coupled to receive the output frequency control, the clock generator generating an oversampling clock based on the output frequency control and an oversampling ratio;
a shift register, coupled to receive the input serial data, the input clock and the input control, the shift register converting the input serial data to parallel data; and
a digital-to-analog converter, coupled to receive the parallel data and the oversampling clock, the digital-to-analog converter converting the parallel data to an analog voltage level.

5. A serial data interface device comprising:
an input port, coupled to receive an input clock, an input control and input serial data from a serial interface bus;
a frequency detector, coupled to receive the input clock and the input control, the frequency detector generating an output frequency control based on a relationship between a frequency of the input clock and a second frequency of the input control, the frequency generator further comprising:
a reference clock generator, generating a reference clock that has a frequency within a range of a known reference frequency;
a counter, coupled to receive the input clock and the reference clock, the counter generating a multiple bit output indicating cycles of a higher frequency clock between the input clock and the reference clock being counted within a lower frequency clock cycle, the multiple bit output being the counting result; and
a processing logic, coupled to receive the multiple bit output, the processing logic generating the output frequency control; and a clock generator, coupled to receive the output frequency control, the clock generator generating an oversampling clock based on the output frequency control and an oversampling ratio.

\* \* \* \* \*